(12) United States Patent
Ayyapureddi et al.

(10) Patent No.: US 9,405,721 B2
(45) Date of Patent: Aug. 2, 2016

(54) APPARATUSES AND METHODS FOR PERFORMING A DATABUS INVERSION OPERATION

(71) Applicant: Micron Technology, Inc., Boise, ID (US)

(72) Inventors: Sujeet Ayyapureddi, Boise, ID (US); Don Morgan, Meridian, ID (US); Myung Gyoo Won, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 99 days.

(21) Appl. No.: 14/297,864

(22) Filed: Jun. 6, 2014

(65) Prior Publication Data
US 2015/0356047 A1   Dec. 10, 2015

(51) Int. Cl.
*G06F 13/42* (2006.01)
*H03M 13/05* (2006.01)

(52) U.S. Cl.
CPC ........... *G06F 13/4221* (2013.01); *H03M 13/05* (2013.01)

(58) Field of Classification Search
CPC ............ G06F 13/4221; G06F 13/4234; G06F 11/183; H03M 13/05; H03M 5/00; H03M 5/16; H03M 5/20; G11C 7/02; G11C 7/1006; G11C 7/1051; G11C 7/1069; G11C 2207/107; Y02B 60/1235; Y02B 60/1228; H04L 25/4917; H04L 12/40182; H04L 25/4915; H04L 25/028
See application file for complete search history.

(56) References Cited

U.S. PATENT DOCUMENTS

| | | | | |
|---|---|---|---|---|
| 6,584,526 B1 * | 6/2003 | Bogin | ................... | G06F 11/10 710/124 |
| 7,280,412 B2 * | 10/2007 | Jang | ................... | G11C 7/1006 326/26 |
| 7,701,368 B2 * | 4/2010 | Hollis | ................... | G11C 7/1006 341/50 |
| 8,766,828 B2 * | 7/2014 | Hollis | ................... | G06F 13/4234 341/58 |
| 8,826,101 B2 * | 9/2014 | Hargan | ................... | G06F 11/10 714/766 |
| 2002/0156953 A1 * | 10/2002 | Beiley | ................... | G06F 13/4273 710/105 |
| 2005/0289435 A1 * | 12/2005 | Mulla | ................... | G06F 11/10 714/758 |
| 2007/0008008 A1 * | 1/2007 | Kwack | ................... | G11C 7/02 326/87 |
| 2008/0019451 A1 * | 1/2008 | Jang | ................... | G11C 7/1006 375/259 |
| 2009/0179782 A1 * | 7/2009 | Hollis | ................... | G11C 7/1006 341/55 |
| 2009/0182918 A1 * | 7/2009 | Hollis | ................... | G06F 13/4234 710/106 |
| 2009/0274245 A1 * | 11/2009 | Brown | ................... | G11C 7/1006 375/340 |
| 2010/0042889 A1 * | 2/2010 | Hargan | ................... | G06F 11/1625 714/752 |
| 2013/0091327 A1 * | 4/2013 | Shido | ................... | G06F 12/00 711/114 |
| 2015/0227417 A1 * | 8/2015 | Kim | ................... | G06F 11/1008 714/764 |
| 2015/0229325 A1 * | 8/2015 | Hollis | ................... | G06F 13/4221 710/106 |

* cited by examiner

*Primary Examiner* — Guerrier Merant
(74) *Attorney, Agent, or Firm* — Dorsey & Whitney LLP

(57) ABSTRACT

Apparatuses and methods for performing a data bus inversion operation (DBI) are described. An example apparatus includes a DBI circuit configured to, in parallel, determine preliminary DBI bits based on a block of data. Individual preliminary DBI bits are associated with respective sub-blocks of the block of data. The DBI circuit is further configured to serially determine DBI bits based on the preliminary DBI bits. Individual ones of the DBI bits are associated with respective ones of the sub-blocks. The DBI circuit is further configured to invert bits of individual sub-blocks responsive to the respective associated DBI bits having a particular logical value to provide DBI data. The apparatus further includes data outputs configured to serially output sub-blocks of the DBI data and the DBI bits.

30 Claims, 6 Drawing Sheets

APPARATUSES AND METHODS FOR PERFORMING A DATABUS INVERSION OPERATION

DESCRIPTION OF RELATED ART

Advances in technology have resulted in making electronic devices smaller and faster, while consuming less power. In an effort to reduce power consumption while communicating data over a series of memory access operations, data bus inversion (DBI) operations may be performed. A DBI operation determines, over a number of signal lines, whether to transmit unmodified data or inverted data based on previously transmitted data. For example, if a first transmission of all zeros is followed by a second transmission of all ones over a set of signal lines, it may be more power efficient to invert the second data of all ones to provide all zeros to allow the signal lines to remain at the same value when providing the second data. The DBI operation may use a DBI bit to indicate whether data is inverted. The inverted second data of all zeros may be inverted again at the receiving end based on the DBI bit so that the second data is correctly interpreted as all ones.

A DBI operation may include dividing a block of data into sub-blocks, with each sub-block having a number of bits equal to a number of data input and outputs (DQs). For each of the sub-blocks, a determination is made whether to invert the bits of a sub-block and the bits are inverted if needed, and a DBI bit for the sub-block is calculated which indicates whether the bits of the sub-block are inverted. The determination, inversion, and the calculation of the DBI bit for the sub-blocks typically occur serially (e.g., completed for one sub-block before moving on to the next sub-block). Because the operations are performed serially, a DBI operation on a block of data may take one clock cycle for each sub-block. Thus, while the DBI operation may reduce power consumption and/or may reduce simultaneous switching noise, it also adds time in providing data.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
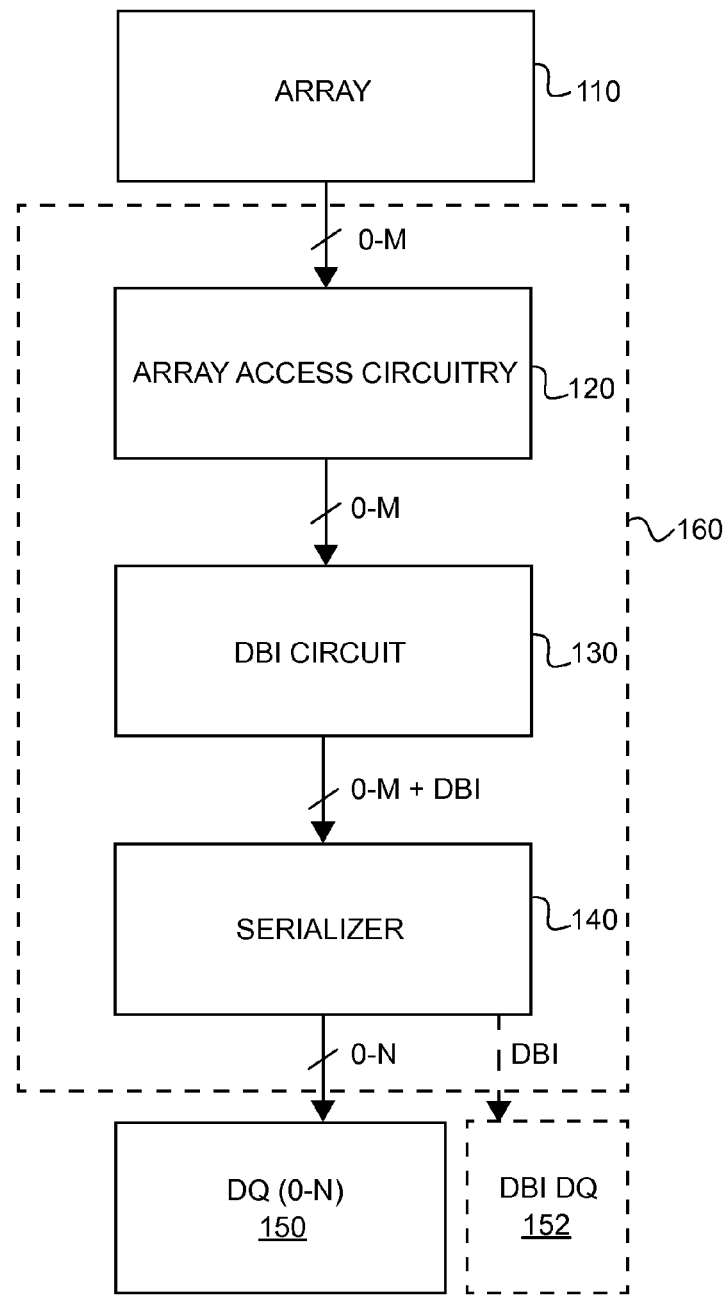
FIG. 1 is a diagram of a particular illustrative embodiment of an apparatus including a DBI circuit, according to an embodiment of the disclosure.

Referring to FIG. 1, a particular illustrative embodiment of an integrated circuit, a memory device, a memory system, an electronic device or system, a smart phone, a tablet, a computer, a server, etc.) including a DBI circuit 130 is disclosed and generally designated apparatus 100. The apparatus 100 may include an array 110 coupled to input/outputs (DQs) DQ(0-N) 150 via memory circuitry 160. The memory circuitry 160 may include a DBI circuit 130.

The memory array may include volatile (e.g., DRAM, SDRAM, etc.) or non-volatile memory (e.g., NAND or NOR flash, PCM, etc.) memory cells. The memory circuitry 160 may include array access circuit 120 to retrieve a block of data having M+1 bits from the array 110. The array access circuit 120 may include circuitry used to access the memory cells of the array 110, such as row and column decoders; read, write, and erase circuitry, etc., to retrieve a block of data. The block of data may include bits 0-M for a total of M+1 bits. The array access circuit 120 may provide the block of data retrieved from the array 110 to the DBI circuit 130.

The DBI circuit 130 may be coupled to the array access circuit 120 to receive the block of data and perform a DBI operation on the block of data to provide DBI data. The DBI circuit 130 may include XOR gates and other logic circuitry used to perform the DBI operation. In some examples, the DBI operation may include, dividing the block of data into sub-blocks having N+1 bits, which may correspond to the N+1 DQ(0-N) 150. The DBI circuit 130 may further determine (e.g., generate), in parallel, a preliminary data bus inversion bit for each sub-block based on a comparison with a previous sub-block. The DBI circuit 130 may further serially determine data bus inversion bits DBI for each sub-block, starting with the first sub-block, based on a comparison between the preliminary DBI bit and a DBI bit of a previous sub-block.

The memory circuitry 160 may further include a serializer 140 that serializes the DBI data and DBI bits and provides the serialized data to the DQ(0-N) 150. In some embodiments, the serializer 140 may provide each DBI bit in parallel with a corresponding sub-block of the DBI data. In other embodiments, the serializer 140 may provide the DBI bits together before or after the DBI data. The DQ(0-N) 150 may provide the DBI data and DBI bits to an external circuit, such as a memory controller. In some embodiments, the DQ(0-N) 150 may provide each DBI bit in parallel with a corresponding sub-block of the DBI data (e.g., the DQ(0-N) 150 includes a DBI dedicated DQ 152). In other embodiments, the DQ(0-N) 150 may provide the DBI bits together before or after transmission of the DBI data.

In operation, the apparatus 100 may receive a read request to an address of the array 110 storing a block of data. The array access circuit 120 may retrieve the block of data from the array 110, and may provide the block of data to the DBI circuit 130. In some examples, a block of data may include M+1 bits, and the M+1 bits may be greater than the N+1 DQs of DQ(0-N) 150. Thus, the block of data may be divided into sub-blocks of N+1 bits to be transmitted serially (e.g., a first sub-block includes bits 0-N of the block of data, a second sub-block includes bits (N+1)-(2N+1) of the block of data, a third sub-block includes bits (2N+2)-(3N+2) of the block of data, etc.). In some embodiments, the serial transmissions of the sub-blocks via the DQ(0-N) 150 may be based on a clock, such as transmitting a sub-block responsive to a beginning of each clock cycle or responsive to each transition of the clock. During the serial transmission, power may be consumed to charge and/or discharge the individual DQ of DQ(0-N) 150 as the data of each sub-block changes. Thus, the DBI circuit 130 may perform a DBI operation to reduce a number of individual DQs of DQ(0-N) 150 that need to be charged and/or discharged between consecutive sub-blocks. The DBI operation may include determining a preDBI bit for each sub-block in parallel based on a sum of output from a bitwise XOR operation with a previous sub-block. The DBI operation may further include determining a DBI bit for each sub-block serially based on an XOR operation between the DBI bit of the previous sub-block and the preDBI bit of the current sub-block. For the sub-blocks that have DBI bits indicating that the bits of the sub-block should be inverted (e.g., has a first logical value, rather than a second logical value), the DBI circuit 130 may invert bits of the block of data to provide DBI data. The DBI circuit 130 may provide the DBI data and the DBI bits to the serializer 140. The serializer 140 may serialize the DBI data and the DBI bits for transmission on the DQ(0-N) 150. For example, transmission of a sub-block may include the serializer 140 providing individual bits of the sub-block to a respective DQ of the DQ(0-N) 150. As previously described, the DQ(0-N) 150 may provide each DBI bit in parallel with a corresponding sub-block of the DBI data (e.g., via the DBI dedicated DQ 152), or the DQ(0-N) 150 may provide the DBI bits together before or after transmission of the DBI data.

In some examples, performing a DBI operation may reduce power consumption based on the reduction of a number of signal lines (and/or DQ(0-N) 150) that need to be charged and/or discharged, as well as reduce heat generation. Further, by performing the comparison of adjacent sub-blocks in parallel, a time to complete the internal DBI operation may be within time constraints imposed by memory standards (e.g., DDR3, DDR4, etc.).

Figure 2:
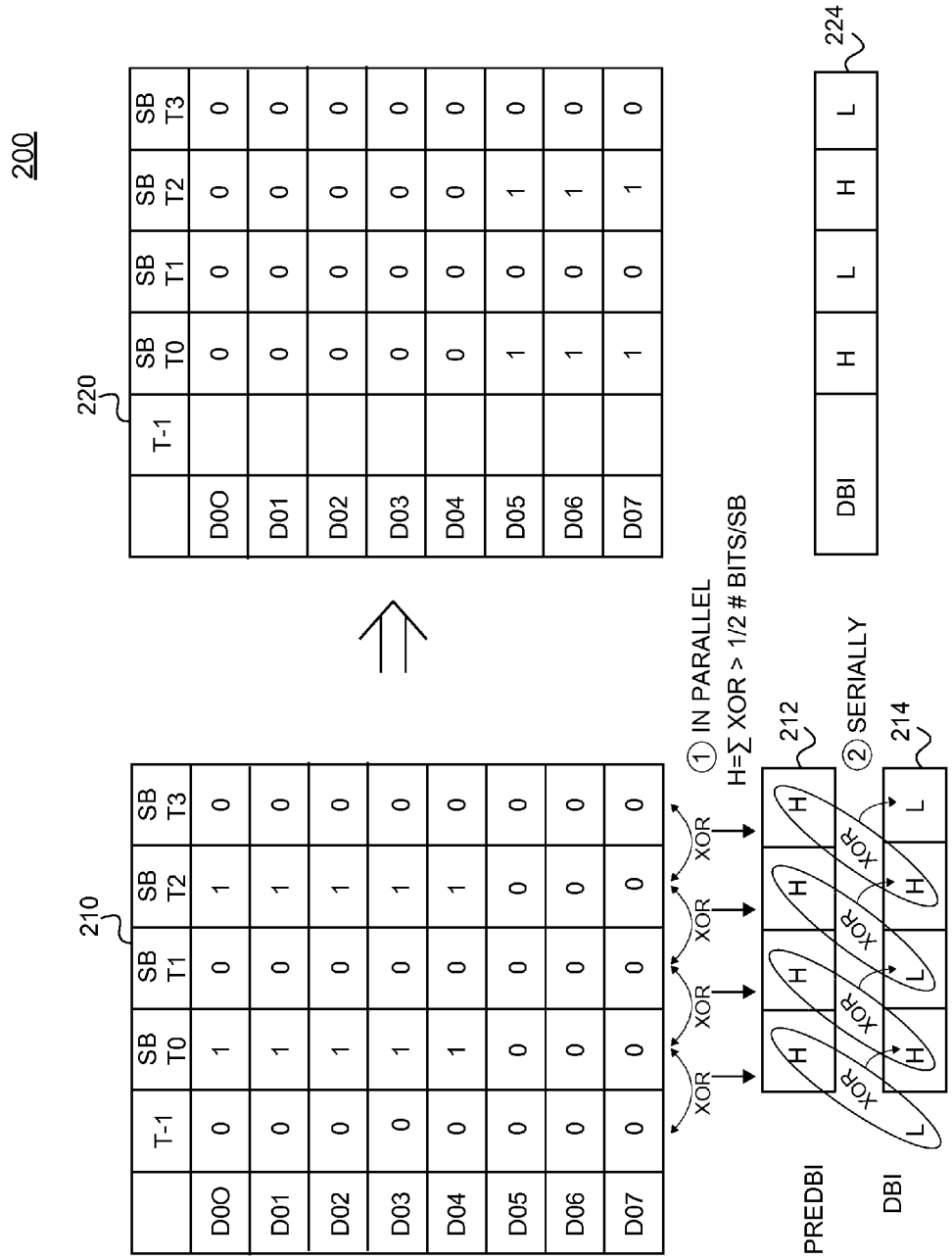
FIG. 2 is a diagram of a particular illustrative embodiment of DBI operation, according to an embodiment of the disclosure.

FIG. 2 depicts an exemplary DBI operation that includes determining a preDBI bit as described with reference to FIG. 1. Table 210 depicts a block of data that includes 32 bits, with the 32 bits divided into 8-bit sub-blocks (e.g., SBT0, SBT1, SBT2, and SBT3). Each bit of a sub-block may be associated with a respective DQ of DQ(0-7). The DBI operation may include determining, in parallel, a respective preDBI bit associated with each of the SBT0-T3 sub-blocks. A preDBI bit for a sub-block may be determined by performing bitwise XOR operation between bits of a previous sub-block and the sub-block, and summing the outputs of the bitwise XOR operation. If a sum of the outputs of the bitwise XOR operations is greater than half of the number of bits in the sub-block, for example, greater than 4 in the present example, then the preDBI bit may be set to a high logical value. Otherwise, the preDBI bit may be set to a low logical value. In some embodiments, the preDBI bit may be set to the high logical value if the sum of the outputs of the bitwise XOR operations is equal to half of the number of bits of the sub-block. The bitwise XOR operation for the first SBT0 sub-block may be with a last sub-block of a previous block of data, or with a default all zero sub-block, as shown in FIG. 2.

In the example depicted in FIG. 2, the bitwise XOR operation for SBT0 may yield 5 high logical values, and thus the preDBI bit may be set to a high logical value H (e.g., the sum of 5 is greater than half of the count of bits of the SBT0). Similarly, the bitwise XOR operation for SBT1, the SBT2, and SBT3 may also each yield 5 high logical values, and thus the corresponding preDBI bits may be set to a high logical values H. Because the bitwise XOR operations use the unmodified data block of data, the bitwise XOR operations used to determine the preDBI bits may be performed in parallel.

The DBI operation may further include determining values of DBI bits based on the preDBI bits. The DBI bits for each of SBT0-T3 may be determined by performing a bitwise XOR operation between a previous DBI bit and a current preDBI bit. The XOR operation for the SBT0 sub-block may use a default low logical value for the previous DBI bit. Because each DBI bit is based on a previous DBI bit, the DBI bits may be determined serially starting with the SBT0 sub-block.

In the example depicted in FIG. 2, the bitwise XOR operation for SBT0 between the default low logical value L and the high logical value H of the preDBI for SBT0 may provide a DBI bit having a high logical value H. The bitwise XOR operation for SBT1 between the high logical value H of the SBT0 DBI bit and the high logical value H of the preDBI for SBT1 may provide a DBI bit having a low logical value L. The bitwise XOR operation for SBT2 between the low logical value L of the SBT1 DBI bit and the high logical value H of the preDBI for SBT2 may provide a DBI bit having a high logical value H. The bitwise XOR operation for SBT3 between the high logical value H of the SBT2 DBI bit and the high logical value H of the preDBI for SBT3 may provide a DBI bit having a low logical value L.

Table 220 depicts the resulting block of data to be transmitted based on the DBI operation, e.g., with the SBT0 and SBT2 data inverted based on the corresponding DBI bits being set to high logical values H. The SBT0-T3 in the table 220 are transmitted serially, starting with SBT0, via the designated DQ0-7, along with the associated DBI bits.

The table 210 and table 220 illustrate examples of the DBI operation that includes determining preDBI bits in parallel. Other examples may include more or less than 8 DQs, and blocks of data may include more or less than 32 bits. Further, the data in the block of data is for illustrative purposes, and a block of data may include any combination of bits. Generating the preDBI bits in parallel based on the bitwise XOR operations, and generating the DBI bits serially based on the preDBI bits, may reduce a time to provide DBI bits as compared with serially performing the bitwise XOR operations and inverting sub-block data to provide the DBI bits. The example depicted in FIG. 2 may also allow the values of the DBI bits to be calculated prior to inverting any of the sub-blocks of the block of data. For example, the total time to perform the DBI operation may include one clock cycle to determine the preDBI bits plus a latency through an XOR gate times a number of DBI.

Figure 3:
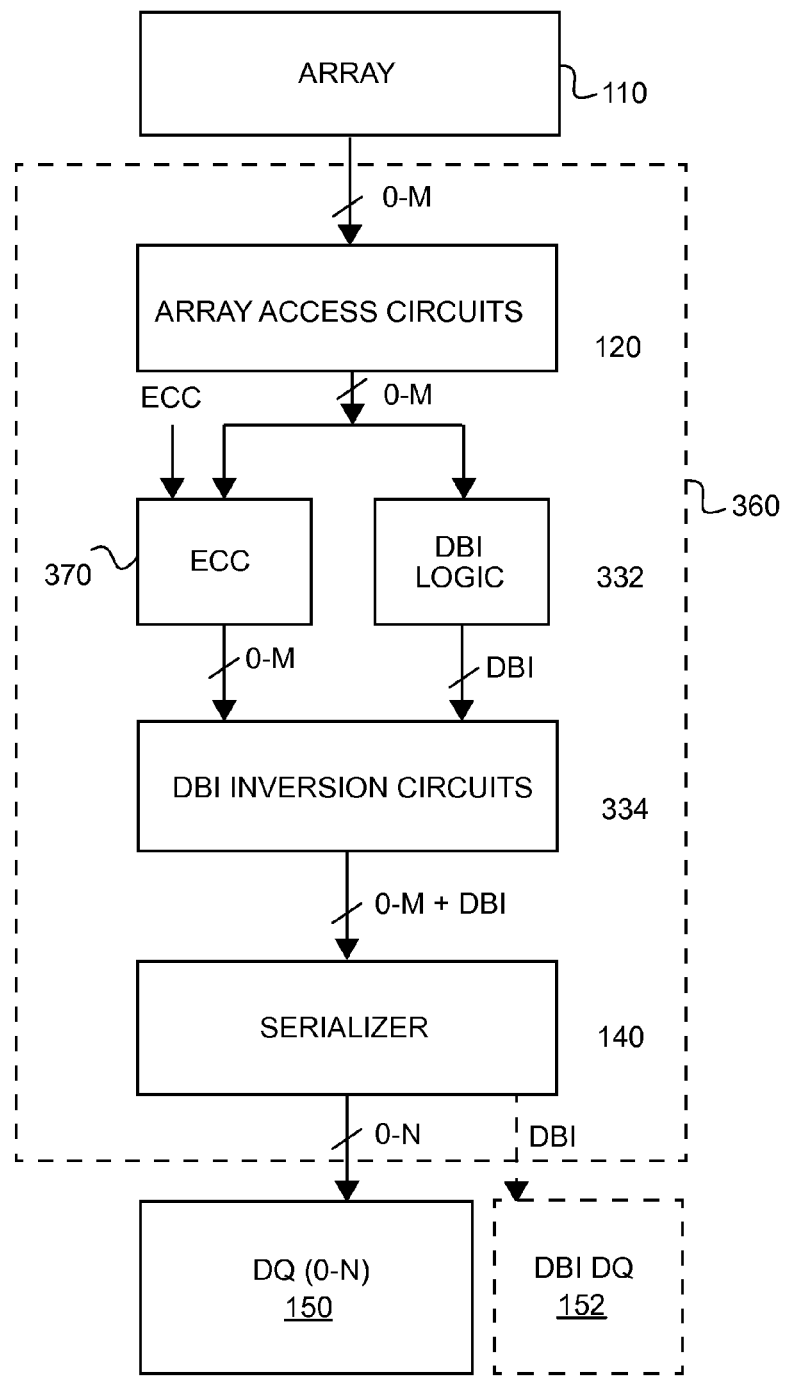
FIG. 3 is a diagram of a particular illustrative embodiment of an apparatus including DBI logic and DBI inverters, according to an embodiment of the disclosure.

Referring to FIG. 3, a particular illustrative embodiment of an apparatus including DBI logic 332 is disclosed and generally designated apparatus 300. The apparatus 300 may include an array 110 coupled to DQs DQ(0-N) 150 via memory circuitry 360. The memory circuitry 360 may include an ECC circuit 370 and DBI logic 332 that are coupled to the array access circuit 120 in parallel. The DBI logic 332 may perform at least a portion of a DBI operation in parallel with the ECC circuit 370 performing error correction calculations, which may reduce latency in providing the block of data to the DQ(0-N) 150. The error correction calculations may include evaluating the block of data provided to the ECC circuit 370 from the array access circuit 120 and correcting errors in the block of data according to an error correction code ECC associated with the block of data. The memory circuitry 360 may be used to implement the memory circuitry 160 of FIG. 1. The apparatus 300 includes elements that have been previously described with respect to the apparatus 100 of FIG. 1. Those elements have been shown in FIG. 3 using the same reference numbers used in FIG. 1, and operation of the common elements is as previously described.

Consequently, a detailed description of the operation of these elements will not be repeated in the interest of brevity.

The ECC circuit 370 and the DBI logic 332 may receive the block of data having M+1 bits from the array access circuit 120 in parallel. Further, as previously described, the ECC circuit 370 may perform the ECC operation on the block of data in parallel with the DBI logic 332 determining the DBI bits based on the block of data. The DBI logic 332 may be included in the DBI circuit 130 of FIG. 1. The DBI logic 332 may include XOR gates and other logic circuitry used to determine the DBI bits. The DBI logic 332 may perform a portion of a DBI operation that includes determining preDBI bits in parallel, and serially determining DBI bits based on the preDBI bits, as described with reference to FIG. 2. The DBI logic 332 may provide the DBI bits to DBI inverters 334. The DBI inverters 334 may complete the DBI operation by inverting bits of the block of data according to the DBI bits to provide DBI data. The DBI inverters 334 may provide the DBI data to the serializer 140.

In operation, the apparatus 300 may receive a read request for a block of data. The array access circuit 120 may retrieve the block of data from the array 110, and may provide the block of data to the ECC circuit 370 and the DBI logic 332. As described with reference to FIG. 1, a block of data may include M+1 bits. The ECC circuit 370 may perform an ECC operation in parallel with the DBI logic 332 performing a portion of a DBI operation to determine DBI bits associated with the block of data. In some embodiments, the ECC circuit 370 may correct a single bit of the block of data to provide a corrected block of data. As previously described, the block of data may be divided into sub-blocks of N+1 bits corresponding to the DQs of DQ(0-N) 150 that are to be transmitted serially. The DBI logic 332 may perform, in parallel with the ECC operation of the ECC circuit 370, a portion of the DBI operation that includes determining a preDBI bit for each sub-block in parallel based on a bitwise XOR operation with a previous sub-block, and, serially determining a DBI bit for each sub-block serially by performing a bitwise XOR operation between the DBI bit of the previous sub-block and the preDBI bit of the current sub-block.

Thus, a time it takes to determine the DBI bits by the DBI logic 332 may be masked by determining the DBI bits in parallel with the ECC operation. In some embodiments, the ECC engine may correct a single bit. Thus, when the ECC circuit 370 corrects a single failing bit, the DBI bits may be based on incorrect data, (e.g., the block of data rather than the corrected block of data). However, having one or more incorrect DBI bits does not affect the corrected block of data provided from the ECC circuit 370 because the inversion is performed at the DBI inverters 334 based on the corrected block of data. In an example where the ECC circuit 370 makes a correction to the block of data, the values of the DBI bits may be off by 1 bit, which may result in at least one incorrect DBI bit. However, the effect of a DBI bit in this scenario may, at worst, result in a power increase equivalent to the power of one signal line. In some embodiments, the DBI bits may be recalculated based on the corrected block of data, which may increase a latency in providing the block of data to the DQs DQ(0-N) 150 for output. The DBI inverters 334 may invert the sub-blocks of the corrected block of data based on values of the respective DBI bits to provide DBI data, and provide the DBI data and DBI bits to the serializer 140. For example, if a DBI bit has a high logical value, the DBI inverters 334 may invert the bits of the corresponding sub-block. Otherwise, if a DBI bit has a low logical value, the DBI inverters 334 may provide the data of corresponding sub-block as is. The serializer 140 may serialize the DBI data and DBI bits for transmission on the DQs DQ(0-N) 150. For example, for each transmission, the serializer 140 may provide each bit of a sub-block to a respective DQ of the DQ(0-N) 150. The DQ(0-N) 150 may provide each DBI bit in parallel with a corresponding sub-block of the DBI data (e.g., via the DBI dedicated DQ 152), or the DQ(0-N) 150 may provide the DBI bits together before or after transmission of the DBI data.

Figure 4:
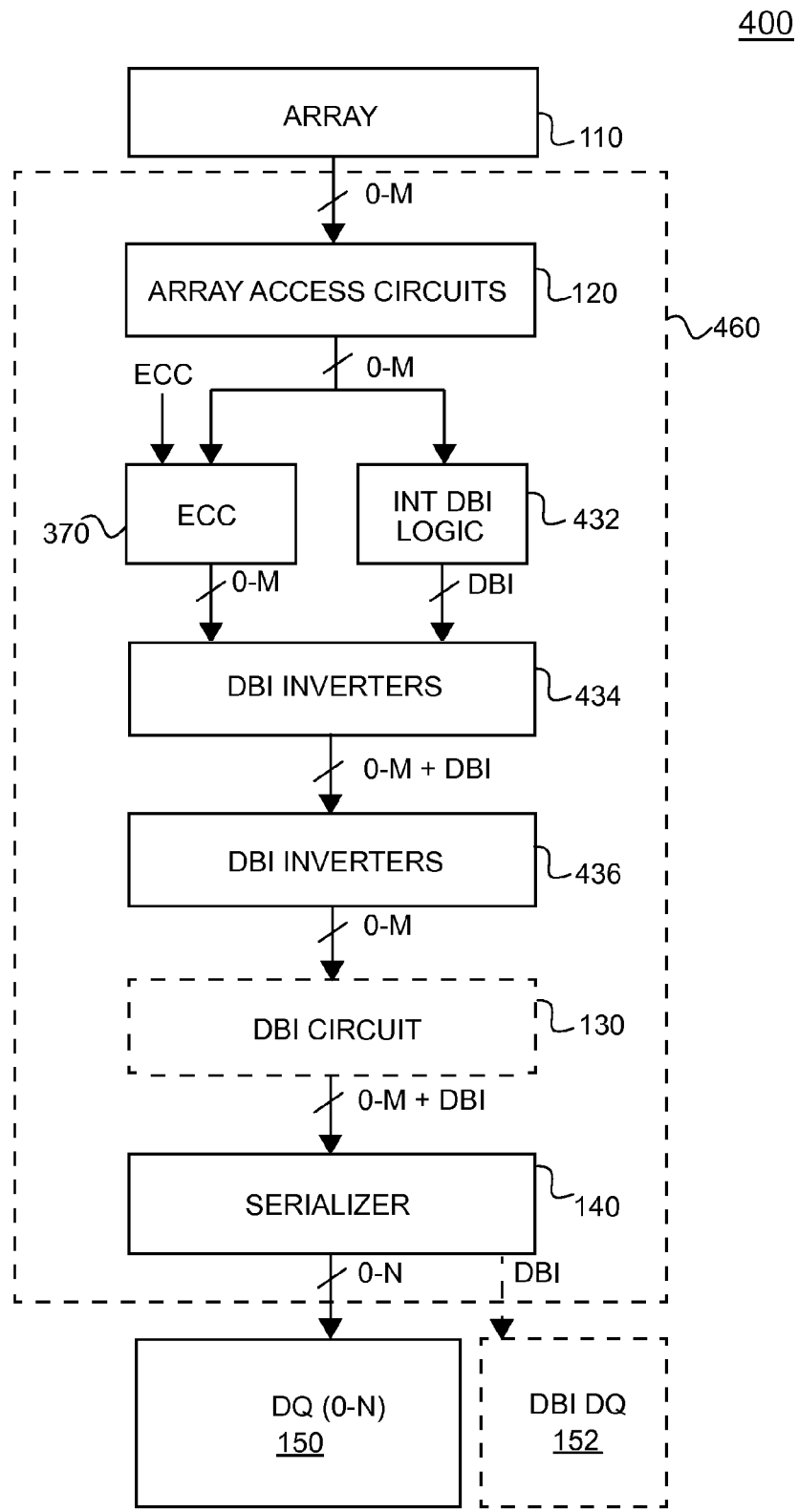
FIG. 4 is a diagram of a particular illustrative embodiment of an apparatus including internal DBI logic and DBI inverters, according to an embodiment of the disclosure.
Figure 5:
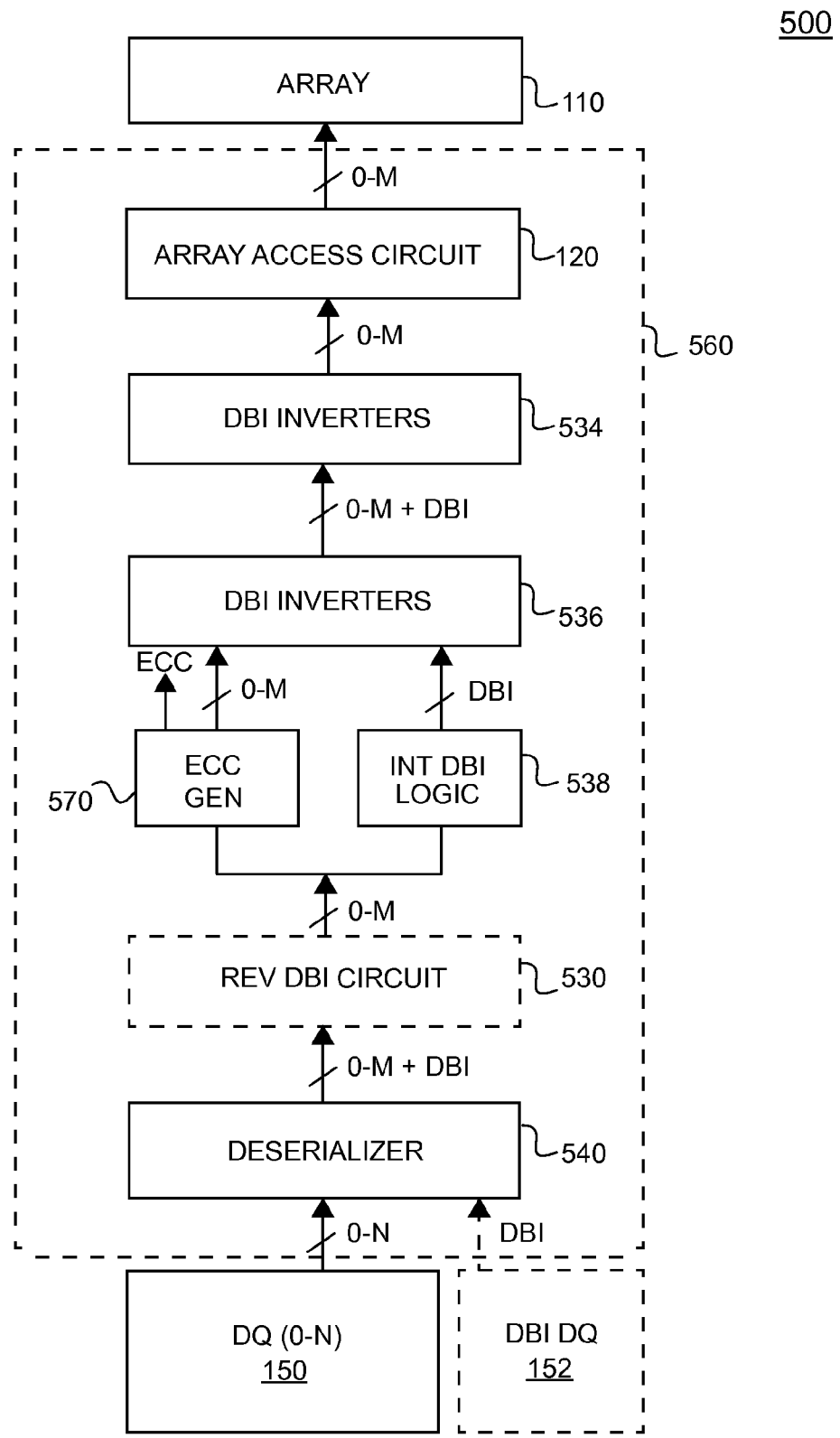
FIG. 5 is a diagram of a particular illustrative embodiment of an apparatus including internal DBI logic and DBI inverters, according to an embodiment of the disclosure.

FIGS. 4 and 5 disclose particular illustrative embodiments of performing internal DBI operations during read and write operations, respectively, to reduce power consumption in providing blocks of data through the memory circuitry. Typically, DBI operations are performed for communication externally over signal lines between apparatuses (e.g., from a memory controller to a memory device). An internal DBI operation may be similar to a typical DBI operation described with reference to FIGS. 1-3, but may be related to communication over signal lines within an apparatus. An internal DBI operation may differ in that an M+1 bit data bus width within an apparatus may differ from an external N+1 bit data bus width. Accordingly, the internal DBI operation may include comparing all or a portion of a single M+1 bit block of data with all or a portion of a previous or subsequent M+1 bit block of data, rather than comparisons between adjacent N+1 bit sub-blocks of the single M+1 bit block of data. Referring to FIG. 4, a particular illustrative embodiment of an apparatus including an internal DBI logic 432, DBI inverters 434, and DBI inverters 436 that perform an internal DBI operation during a read operation is disclosed and generally designated apparatus 400. The apparatus 400 may include an array 110 coupled to DQs DQ(0-N) 150 via memory circuitry 460. The memory circuitry 460 may include an ECC circuit 370 and internal DBI logic 432 that are coupled to the array access circuit 120 in parallel. The internal DBI logic 432 may perform a portion of a DBI operation in parallel with the ECC circuit 370 preforming an ECC operation, which may reduce latency in providing the block of data to the DQ(0-N) 150. The memory circuitry 460 may be used to implement the memory circuitry 160 of FIG. 1 and/or the memory circuitry 360 of FIG. 3. The apparatus 400 includes elements that have been previously described with respect to the apparatus 100 of FIG. 1 and/or the apparatus 300 of FIG. 3. Those elements have been shown in FIG. 4 using the same reference numbers used in FIG. 1 and/or FIG. 3, and operation of the common elements is as previously described. Consequently, a detailed description of the operation of these elements will not be repeated in the interest of brevity.

The ECC circuit 370 and the internal DBI logic 432 may receive the block of data having M+1 bits from the array access circuit 120 in parallel. The ECC circuit 370 may perform the ECC operation on the block of data to correct errors according to error correction code ECC associated with the block of data, and provide the corrected block of data to the DBI inverters 434. The DBI logic 432 may perform a portion of an internal DBI operation on the block of data to determine internal DBI bits in parallel with the ECC circuit 370 performing the ECC operation on the block of data. The internal DBI logic 432 may include XOR gates and other logic circuitry used to determine the internal DBI bits. In some embodiments, the internal DBI logic 432 may perform a portion of a DBI operation to determine preDBI bits in parallel, and then determine the internal DBI bits based on the preDBI bits, as described with reference to FIG. 2. The internal DBI logic 432 may provide the internal DBI bits to the DBI inverters 434.

The DBI inverters 434 may complete the internal DBI operation by inverting sub-blocks of the corrected blocks of data received from the ECC circuit 370 based on the internal DBI bits to provide internal DBI data plus the internal DBI bits to the DBI inverters 436. Between the inverters 434 and the inverters 436 is an internal data bus having M+1 signal lines. Consecutively transmitting the internal DBI data and the internal DBI bits over the internal signal bus, rather than consecutively transmitting the corrected blocks of data, may reduce a number of signal lines that need updated polarity between transmissions within the memory circuitry 460. Prior to providing the corrected blocks of data at an output (e.g., the DQ(0-N) 150, the DBI inverters 436 may recover the corrected block of data by reversing the inversion of the sub-blocks inverted by the DBI inverters 434 based on the values of the internal DBI bits. In some embodiments, the DBI inverters 436 may provide the block of data to the DBI circuit 130, which may perform a DBI operation on each corrected block of data as described with reference to FIG. 1. The DBI circuit 130 may have to perform the second DBI operation due to the fact that the DBI bits are calculated based on different bus widths (e.g., N+1 bit bus width) than the internal DBI data bits (e.g., M+1 bit bus width). Thus, the DBI bits provided to the DQ(0-N) 150 for output correspond to different data than the internal DBI bits. In other embodiments, the DBI inverters 436 may provide the block of data directly to the serializer 140, such as when a receiving device (e.g., memory controller) does not support DBI.

In operation, the apparatus 400 may receive a series of consecutive read requests associated with addresses of the array 110 that are storing blocks of data. The array access circuit 120 may retrieve the blocks of data from the array 110, and may provide the blocks of data to the ECC circuit 370 and the internal DBI logic 432. As described with reference to FIG. 1, each block of data may include M+1 bits. The ECC circuit 370 may perform an ECC operation in parallel with the internal DBI logic 432 performing a portion of a DBI operation to determine DBI bits associated with the blocks of data.

In some embodiments, the internal DBI logic 432 may determine a single internal DBI bit for each block of data based on a comparison with a previous block of data. Providing a single DBI bit for each block of data may reduce a complexity of the DBI logic 432 and the DBI inverters 436 circuitry, but may have limited resolution (e.g., at least half of the M+1 bits between two consecutive blocks of data may have to be different to set the DBI bit).

In other embodiments, the internal DBI logic 432 may divide each block of data into sub-blocks, and may compare each sub-block with a previous corresponding sub-block to determine a respective internal DBI bit. For example, if each block of data has 32 bits and is divided into 8-bit sub-blocks, each block of data would have 4 DBI bits. In this example, the internal DBI logic 432 may compare a first 8 bits of a second block of data with a first 8 bits of a first block of data to determine an internal DBI bit value. Breaking the blocks of data into sub-blocks for comparison may improve resolution as compared with determining a single DBI bit for each block of data, but may increase complexity of the DBI logic 432 and the DBI inverters 436 circuitry. For example, in a scenario where a first 32-bit block of data is transmitted '0x00000000' followed by a second 32-bit block of data is '0xF0F0F0E0', a single DBI bit for the second block of data may indicate that the data bits should not be inverted, and the polarity of 15 signal lines may need to be updated. Alternatively, if each block of data is divided into 8-bit sub-blocks, and 4 DBI bits are calculated for the second block of data, the polarity of only 1 signal line may need to be changed. In some embodiments, the internal DBI logic 432 may perform a DBI operation similar to the DBI operation described with reference to FIG. 2 when transmitting more than two blocks of data consecutively (e.g., by performing the first XOR comparison in parallel to determine the preDBI bits, and then performing the second XOR comparison serially to determine the DBI bits), which may reduce a time required to determine the DBI bits. In other embodiments, the internal DBI may be determined using conventional DBI algorithms. The DBI inverters 434 may receive each corrected block of data from the ECC circuit 370 serially, and the internal DBI bits from the internal DBI logic 432. The DBI inverters 434 may invert one or more corrected blocks of data or portions of corrected blocks of data based on the received internal DBI bits to provide internal DBI data. The DBI inverters 434 may provide the internal DBI data to the DBI inverters 436 to recover the corrected data blocks. By using the internal DBI operation, via the internal DBI logic 432, the DBI inverters 434, and the DBI inverters 436, power consumption in the apparatus 400 may be reduced by reducing a number of the 0-M signal lines that need to be charged and/or discharged to provide each block of data.

In some embodiments, the DBI inverters 436 may provide the corrected blocks of data to the DBI circuit 130. As previously described with reference to FIG. 1, the DBI circuit 130 may perform a DBI operation on each block of data to provide DBI data to the serializer 140, and the serializer 140 may serialize the DBI data and provide the DBI data to the DQ(0-N) 150. The DQ(0-N) 150 may provide each DBI bit in parallel with a corresponding sub-block of the DBI data (e.g., via the DBI dedicated DQ 152), or the DQ(0-N) 150 may provide the DBI bits together before or after transmission of the DBI data. In other embodiments that do not support DBI, the DBI inverters 436 may provide the corrected blocks of data directly to the serializer 140.

A DBI operation may generally be employed to reduce a number of signal lines that require a polarity change (e.g., to be charged or discharged) between consecutive transmissions. Thus, in the memory circuitry 460 with M+1 signal lines, consecutive transmission over a single one of these lines may include a bit from a first corrected block of data followed by a bit in the same corresponding bit position from a second corrected block of data. Further, when the memory circuitry 460 is coupled to N+1 DQ(0-N) 150 for transmission of data, consecutive transmission via a single DQ may include a bit from a first sub-block of data followed by a bit in the same corresponding bit position from a second sub-block of data. If M is different than N, then the consecutive bits transmitted may be based on different data. For example, if an internal memory bus has 32 signal lines, a data block may have 32 bits and the internal DBI operation may generate internal DBI data based on a comparison between consecutively transmitted 32 bits data blocks. However, an output bus (e.g., coupled to the DQ(0-N) 150) may have only 8 bits, and the DBI circuit 130 generate the DBI data based on a comparison between consecutively transmitted 8-bit sub-blocks of a single 32 bit data block. Therefore, because the internal DBI operation performed by the internal DBI logic 432 and the DBI inverters 434 may be based on comparison of consecutive blocks of data (e.g., rather than sub-blocks within a single block of data), the DBI circuit DBI inverters 436 may be employed to recover the corrected block of data and the DBI logic 130 may be configured to provide the DBI data to the DQ(0-N) 150 based on comparisons of sub-blocks of a single corrected block of data. In embodiments where a data bus width of the internal data bus is equal to a number of DQ(0-N) (e.g., N is equal to M), the internal DBI data from the DBI inverters 434 may be provided directly to the DQ(0-N) 150.

Referring to FIG. 5, a particular illustrative embodiment of an apparatus including an internal DBI logic 538, DBI inverters 534, and DBI inverters 536 that perform an internal DBI operation during a write operation is disclosed and generally designated apparatus 500. The apparatus 500 may include an array 110 coupled to DQs DQ(0-N) 150 via memory circuitry 560. The memory circuitry 560 may include an internal DBI logic 538, DBI inverters 534, and DBI inverters 536 that may perform an internal DBI operation to reduce power required to provide data from the memory circuitry 560 to the array 110. The apparatus 500 includes elements that have been previously described with respect to the apparatus 100 of FIG. 1, the apparatus 300 of FIG. 3, and/or the apparatus 400 of FIG. 4. Those elements have been shown in FIG. 5 using the same reference numbers used in FIG. 1, FIG. 3, and/or FIG. 4, and operation of the common elements is as previously described. Consequently, a detailed description of the operation of these elements will not be repeated in the interest of brevity.

The DQs DQ(0-N) 150 may serially receive a series of sub-blocks that may be assembled to form a block of data to be written to the array 110, and, if DBI is enabled, DBI bits. The DQ(0-N) 150 may receive each DBI bit in parallel with a corresponding sub-block of the DBI data (e.g., via the DBI dedicated DQ 152), or the DQ(0-N) 150 may receive the DBI bits together before or after transmission of the DBI data. The memory circuitry 560 may include a deserializer 540 that is coupled to the DQ(0-N) 150 that deserializes the sub-blocks to form a received block of data. In embodiments where DBI is enabled, the memory circuitry 560 may include a reverse DBI circuit 530 that receives the received block of data and performs a reverse DBI operation to recover the block of data based on the received DBI bits. The reverse DBI circuit 530 may provide the block of data to an ECC generator 570 and an internal DBI logic 538 in parallel. In other embodiments where DBI is not enabled, the deserializer 540 may provide the block of data directly to the ECC generator 570 and internal DBI logic 538 in parallel.

The ECC generator 570 may provide an error correction code ECC for the block of data and provide the block of data and the ECC to the DBI inverters 536. The internal DBI logic 538 may provide one or more internal DBI bits based on a comparison of the block of data with a previously written block of data, and provide the one or more internal DBI bits to the DBI inverters 536. The DBI inverters 536 may invert bits of the block of data based on values of the one or more DBI bits to provide internal DBI data. The DBI inverters 536 may provide the internal DBI data, the ECC, and the one or more internal DBI bits to the DBI inverters 534. Between the inverters 434 and the inverters 436 is an internal data bus having M+1 signal lines. Consecutively transmitting the internal DBI data and the internal DBI bits over the internal signal bus, rather than consecutively transmitting the corrected blocks of data, may reduce a number of signal lines that need updated polarity between transmissions within the memory circuitry 460. Prior to being provided to the array access circuit 120, the DBI inverters 534 may reverse the inversion performed by the internal DBI data based on the internal DBI bits to recover the block of data. The DBI inverters 534 may provide the block of data and the ECC to the array access circuit 120, which may write the block of data and the ECC to the array 110.

In operation, the apparatus 500 may receive a series of consecutive write requests for blocks of data to be written to the array 110. Received blocks of data corresponding to the series of write request may be divided into sub-blocks of N+1 bits and provided to the DQs DQ(0-N) 150 serially. The deserializer 540 may receive the serialized sub-blocks and deserialize one or more sub-blocks to construct a received block of data having M+1 bits. A number of sub-blocks in a block of data may be determined by dividing M+1 by N+1. In embodiments where DBI is not enabled, the received blocks of data are the data to be written to the array 110, and the deserializer 540 may provide the blocks of data directly to the ECC generator 570 and the internal DBI logic 538.

In embodiments where DBI is enabled, the received blocks of data may require a reverse DBI operation to be performed to recover the blocks of data to be written to the array 110. Thus, the DQs DQ(0-N) 150 may also receive DBI bits associated with each received sub-block, and the deserializer 540 may provide the received block of data and the DBI bits to the reverse DBI circuit 530. The reverse DBI circuit 530 may recover each block of data by reversing the DBI operation based on the DBI bits. As previously described, the N+1 number of DQ(0-N) 150 may differ from the M+1 signal lines of the internal circuitry. Therefore, the reverse DBI circuit 530 may perform a reverse DBI operation to recover the blocks of data, which may then be subjected to an internal DBI operation for transmission over the internal M+1 signal lines. The reverse DBI circuit 530 may provide the blocks of data to the ECC generator 570 and the internal DBI logic 538. The ECC generator 570 may provide a respective ECC for each block of data, which will be stored with the associated block of data in the array 110. The ECC generator 570 may serially provide each block of data and the respective ECC to the DBI inverters 536.

As previously described, an internal bus of M+1 signal lines may run through the memory circuitry 560 between DBI inverters 536 and DBI inverters 534. The internal DBI operation performed by the internal DBI logic 538, DBI inverters 536, and/or DBI inverters 534 may reduce a number of signal lines between the DBI inverters 536 and DBI inverters 534 that require a polarity change (e.g., charged or discharged) between transmissions of blocks of data to be written to the array 110. Thus, the internal DBI logic 538 may determine one or more internal DBI bits for each block of data based on a comparison with a previous block of data as previously described with reference to FIG. 4. In some embodiments, the internal DBI logic 538 may perform a portion of a DBI operation similar to the DBI operation described with reference to FIG. 2 when transmitting more than two blocks of data consecutively (e.g., by determining preDBI bits in parallel, and then generating the DBI bits serially), which may reduce a time required to determine the DBI bits. In other embodiments, the internal DBI may be determined using conventional DBI algorithms.

The DBI inverters 536 may receive the blocks of data (and corresponding ECCs) from the ECC generator 570 serially, and the internal DBI bits from the internal DBI logic 538. In some embodiments, the internal DBI logic 538 may also determine a DBI bit for the ECC based on a comparison with an ECC associated with a previously transmitted block of data. The DBI inverters 536 may complete the internal DBI operation by inverting one or more of the blocks of data or portions of the blocks of data based on the internal DBI bits to provide internal DBI data blocks. The DBI inverters 536 may provide the internal DBI data blocks and the internal DBI bits to the DBI inverters 534. The DBI inverters 534 may use the internal DBI bits to recover the blocks of data by reversing the inversion performed by the DBI inverters 536. The DBI inverters 534 may provide the blocks of data to the array access circuit 120, which may write the blocks of data to the array 110.

In some embodiments, the ECC generator 570 and the internal DBI logic 538 may be arranged serially, where the ECC generator 570 provides the blocks of data and the ECCs to the internal DBI logic 538, and the internal DBI logic 538 determines the internal bits for the blocks of data and the ECCs. In other embodiments, the ECC generator 570 may be located between the DBI inverters 534 and the array access circuit 120, and may receive blocks of data from the DBI inverters 534 and may provide the ECCs associated with the blocks of data. The ECC generator 570 may provide the blocks of data and the ECCs to the array access circuit 120. In this example, the deserializer 540 or the reverse DBI circuit 530 may provide the blocks of data directly to the internal DBI logic 538.

While FIGS. 1-5 may describe the DBI and internal DBI operations in the context of memory applications or memory circuits, it will be appreciated that the DBI operation and the internal DBI operation may be employed in any setting where data is communicated over signal lines to reduce a number of signal lines that require a change in polarity between consecutive data transmissions. Thus, the previously described examples are not intended to be limited to memory applications or memory circuitry.

Figure 6:
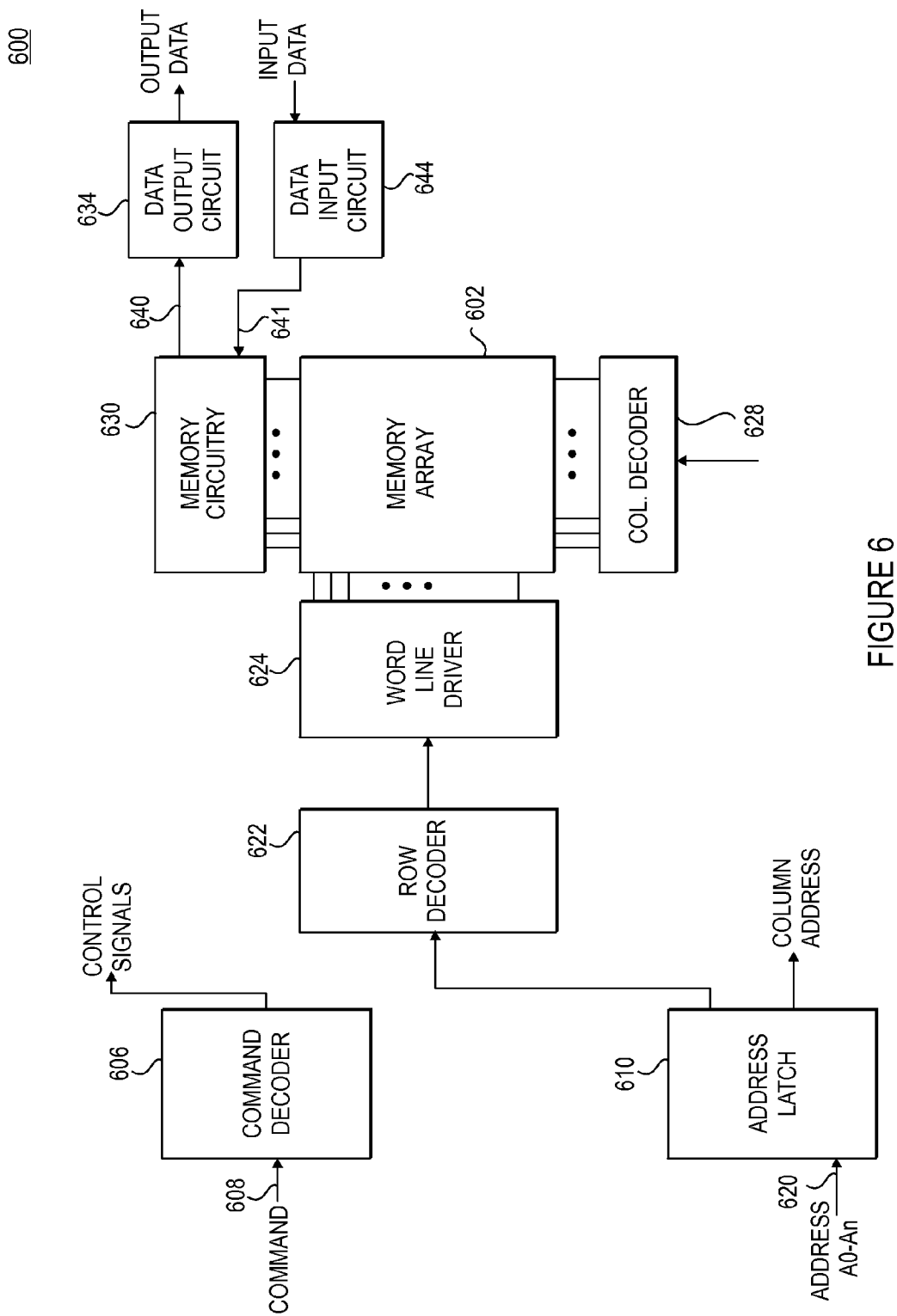
FIG. 6 is a diagram of a particular illustrative embodiment of a memory including a DBI circuit, according to an embodiment of the disclosure.

FIG. 6 illustrates a portion of a memory 600 according to an embodiment of the present disclosure. The memory 600 includes a memory array 602 of memory cells, which may be, for example, volatile memory cells (e.g., DRAM memory cells, SRAM memory cells), non-volatile memory cells (e.g., flash memory cells, phase change memory cells), or some other types of memory cells. The memory 600 includes a command decoder 606 that receives memory commands through a command bus 608 and generates corresponding control signals within the memory 600 to carry out various memory operations. Row and column address signals are applied to the memory 600 through an address bus 620 and provided to an address latch 610. The address latch then outputs a separate column address and a separate row address.

The row and column addresses are provided by the address latch 610 to a row decoder 622 and a column address decoder 628, respectively. The column address decoder 628 selects bit lines extending through the memory array 602 corresponding to respective column addresses. The row decoder 622 is connected to wordline driver 624 that activates respective rows of memory cells in the memory array 602 corresponding to received row addresses. The selected digit line (e.g., a bit line or bit lines) corresponding to a received column address are coupled to memory circuitry 630 to provide read data to a data output circuit 634 via an output data bus 640. An output pad coupled to the data output circuit 634 is used for electrically coupling to the memory 600. Write data are applied to the memory array 602 through a data input circuit 644 and the memory array memory circuitry 630 via an input data bus 641. The memory circuitry may include the memory circuitry 160 of FIG. 1, the memory circuitry 360 of FIG. 3, the memory circuitry 460 of FIG. 4, and/or the memory circuitry 560 of FIG. 5. The data output bus 640 may include a data path described with reference to FIGS. 1, 3, and/or 4. The data input bus 641 may include a data path described with reference to FIG. 5. An input pad coupled to the data input circuit 644 is used for electrically coupling to the memory 600. The command decoder 606 responds to memory commands applied to the command bus 608 to perform various operations on the memory array 602. In particular, the command decoder 606 is used to generate internal control signals to read data from and write data to the memory array 602.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:
1. An apparatus, comprising:
a data bus inversion (DBI) circuit configured to determine, in parallel, a plurality of preliminary DBI bits based on a received block of data, each of the preliminary DBI bits having a value based on a sum of bitwise XOR comparisons of a sub-block of the block of data with a preceding sub-block of the block of data, wherein individual ones of the plurality of preliminary DBI bits are associated with respective ones of a plurality of sub-blocks of the block of data, the DBI circuit further configured to serially determine a plurality of DBI bits based on the plurality of preliminary DBI bits, wherein individual ones of the plurality of DBI bits are associated with respective ones of the plurality of sub-blocks, the DBI circuit further configured to invert bits of sub-blocks of the plurality of sub-blocks responsive to the respective associated DBI bits of the plurality of DBI bits having a particular logical value to provide DBI data; and
a plurality of data outputs configured to serially output sub-blocks of the DBI data and the plurality of DBI bits.
2. The apparatus of claim 1, wherein the DBI logic is configured to set a value for a preliminary DBI bit of the plurality of preliminary DBI bits to a first logical value when the respective sum of outputs of the bitwise XOR logic is equal to or greater than half of a number of bits of a sub-block of the plurality of sub-blocks, and wherein the DBI logic is configured to set the value for the preliminary DBI bit of the plurality of preliminary DBI bits to a second logical value when the respective sum of outputs of the bitwise XOR logic is less than half of the number of bits of the sub-block of the plurality of sub-blocks.
3. An apparatus, comprising:
a data bus inversion (DBI) circuit configured to determine, in parallel, a plurality of preliminary DBI bits based on a received block of data, wherein individual ones of the plurality of preliminary DBI bits are associated with respective ones of a plurality of sub-blocks of the block of data, the DBI circuit further configured to serially determine a plurality of DBI bits based on the plurality of preliminary DBI bits, wherein individual ones of the plurality of DBI bits are associated with respective ones of the plurality of sub-blocks, the DBI circuit further configured to invert bits of sub-blocks of the plurality of sub-blocks responsive to the respective associated DBI bits of the plurality of DBI bits having a particular logical value to provide DBI data; and
a plurality of data outputs configured to serially output sub-blocks of the DBI data and the plurality of DBI bits,
wherein the DBI circuit comprises DBI logic that is configured to, in parallel, compare individual ones of the plurality of sub-blocks with respective preceding sub-blocks using bitwise XOR logic, the DBI logic further configured to, in parallel, set a value of the each of the plurality of preliminary DBI bits based on a respective sum of outputs of the bitwise XOR logic, and
the DBI logic is further configured to set a value of a DBI bit of the plurality of DBI bits associated with a sub-block of the plurality of sub-blocks based on a comparison between a preliminary DBI bit of the plurality of preliminary DBI bits associated with the sub-block and a DBI bit of the plurality of DBI bits associated with a preceding sub-block of the plurality of sub-blocks using XOR logic.

4. The apparatus of claim 1, wherein the DBI circuit further comprises DBI inverters configured to invert bits of a sub-block of the plurality of sub-blocks responsive to the respective associated DBI bit of the plurality of DBI bits having the particular logical value.

5. The apparatus of claim 1, wherein the DBI logic is configured to set a value for a preliminary DBI bit of the plurality of preliminary DBI bits to a first logical value when the respective sum of outputs of the bitwise XOR logic is greater than half of a number of bits of a sub-block of the plurality of sub-blocks, and wherein the DBI logic is configured to set the value for the preliminary DBI bit of the plurality of preliminary DBI bits to a second logical value when the respective sum of outputs of the bitwise XOR logic is equal to or less than half of the number of bits of the sub-block of the plurality of sub-blocks.

6. The apparatus of claim 1, further comprising an error correction code (ECC) circuit configured to perform an ECC operation on the block of data to provide a corrected block of data, wherein the ECC circuit is configured to perform the ECC operation in parallel with determining the plurality of preliminary DBI bits and determining the plurality of DBI bits by the DBI circuit.

7. The apparatus of claim 6, wherein the DBI circuit being configured to invert bits of the sub-blocks that are associated with the plurality of DBI bits having the particular logical value to provide DBI data comprises the DBI circuit being configured to invert bits of sub-blocks of the corrected block of data from the ECC circuit.

8. The apparatus of claim 1, further comprising array access circuitry configured to retrieve the block of data from an array of memory cells and to provide the block of data to the DBI circuit.

9. The apparatus of claim 1, further comprising an array of memory cells configured to store the block of data.

10. The apparatus of claim 1, further comprising a serializer coupled to the DBI circuit and configured to receive the DBI data, the serializer configured to divide the block of data into the plurality of DBI sub-blocks, the serializer further configured to serially provide individual ones of the plurality of DBI sub-blocks to the plurality of outputs.

11. An apparatus, comprising:
an error correction code (ECC) circuit configured to receive a first block of data and a second block of data from an array of memory cells, the ECC circuit further configured to perform an ECC operation on the second block of data to provide a corrected block of data;
data bus inversion (DBI) logic configured to perform at least a portion of a DBI operation on the second block of data, the DBI operation including determining a DBI bit associated with the second block of data based on a comparison between the first block of data and the second block of data, wherein at least a portion of the DBI operation is performed in parallel with at least a portion of the ECC operation, and the DBI logic is further configured to perform a second comparison between the first block of data and the corrected block of data to determine a value of the DBI bit responsive to the second block of data being different than the corrected block of data; and
a DBI inverter coupled to the ECC circuit and the DBI logic, the DBI inverter configured to provide DBI data based on the corrected block of data and the DBI bit, wherein provision of the DBI data comprises inversion of at least a portion of the corrected block of data responsive to the DBI bit having a particular logical value.

12. The apparatus of claim 11, further comprising a second DBI inverter coupled to the DBI inverter via a plurality of signal lines, the second DBI inverter configured to recover the corrected block of data based on the DBI data and the DBI bit, wherein recovery of the corrected block of data comprises inversion of at least a portion of the DBI data responsive to the DBI bit having the particular logical value.

13. The apparatus of claim 12, further comprising a serializer coupled to the second DBI inverter, the serializer configured to divide the corrected block of data into a plurality of sub-blocks, the serializer further configured to serially provide individual ones of the plurality of sub-blocks to a plurality of outputs.

14. An apparatus, comprising:
an error correction code (ECC) circuit configured to receive a first block of data and a second block of data from an array of memory cells, the ECC circuit further configured to perform an ECC operation on the second block of data to provide a corrected block of data;
data bus inversion (DBI) logic configured to perform at least a portion of a DBI operation on the second block of data, the DBI operation including determining a DBI bit associated with the second block of data based on a comparison between the first block of data and the second block of data, wherein at least a portion of the DBI operation is performed in parallel with at least a portion of the ECC operation; and
a DBI inverter coupled to the ECC circuit and the DBI logic, the DBI inverter configured to provide DBI data based on the corrected block of data and the DBI bit, wherein provision of the DBI data comprises inversion of at least a portion of the corrected block of data responsive to the DBI bit having a particular logical value;
a second DBI inverter coupled to the DBI inverter via a plurality of signal lines, the second DBI inverter configured to recover the corrected block of data based on the DBI data and the DBI bit, wherein recovery of the corrected block of data comprises inversion of at least a portion of the DBI data responsive to the DBI bit having the particular logical value;
a serializer coupled to the second DBI inverter, the serializer configured to divide the corrected block of data into a plurality of sub-blocks, the serializer further configured to serially provide individual ones of the plurality of sub-blocks to a plurality of outputs; and
a DBI circuit coupled between the serializer and the second DBI inverter, the DBI circuit configured to perform a DBI operation on the corrected block of data to provide DBI data to the serializer, the serializer configured to divide the DBI data into the plurality of sub-blocks.

15. The apparatus of claim 11, wherein the DBI logic is further configured to provide a plurality of DBI bits, wherein each of the plurality of DBI bits is associated with a respective sub-block of the second block of data, wherein a value of a DBI bit of the plurality of DBI bits is based on a comparison between a respective sub-block of the second block of data and a corresponding sub-block of the first block of data.

16. The apparatus of claim 11, wherein the DBI logic is configured to perform a first bitwise XOR operation between the first block of data and the second block of data, the DBI logic further configured to set a preliminary DBI bit to a first logical value responsive to a sum of the outputs of the first bitwise XOR operation being greater than half of a count of bits of the second block of data, the DBI logic further configured to set the preliminary DBI bit to a second logical value responsive to the sum of the outputs of the first bitwise XOR operation being less than half of the count of bits of the second block of data, wherein the DBI logic is further configured to determine the DBI bit based on the comparison between a DBI bit associated with the first block of data and the preliminary DBI bit using XOR logic.

17. An apparatus, comprising:
an error correction code (ECC) circuit configured to receive a first block of data and a second block of data from an array of memory cells, the ECC circuit further configured to perform an ECC operation on the second block of data to provide a corrected block of data;
data bus inversion (DBI) logic configured to perform at least a portion of a DBI operation on the second block of data, the DBI operation including determining a DBI bit associated with the second block of data based on a comparison between the first block of data and the second block of data, wherein at least a portion of the DBI operation is performed in parallel with at least a portion of the FCC operation; and
a DBI inverter coupled to the ECC circuit and the DBI logic, the DBI inverter configured to provide DBI data based on the corrected block of data and the DBI bit, wherein provision of the DBI data comprises inversion of at least a portion of the corrected block of data responsive to the DBI bit having a particular logical value,
wherein the DBI logic is configured to perform a first bitwise XOR operation between the first block of data and the second block of data, the DBI logic further configured to set a preliminary DBI bit to a first logical value responsive to a sum of the outputs of the first bitwise XOR operation being greater than half of a count of bits of the second block of data, the DBI logic further configured to set the preliminary DBI bit to a second logical value responsive to the sum of the outputs of the first bitwise XOR operation being less than half of the count of bits of the second block of data, wherein the DBI logic is further configured to determine the DBI bit based on the comparison between a DBI bit associated with the first block of data and the preliminary DBI bit 40 using XOR logic, and
wherein the DBI logic is further configured to receive a third block of data, the DBI logic further configured to perform a second bitwise XOR operation between the second block of data and the third block of data, wherein the second bitwise XOR operation is performed in parallel with the first bitwise XOR operation, the DBI logic further configured to set a value of a second preliminary DBI bit associated with the third block of data based on a sum of outputs of the second bitwise comparison, wherein the DBI logic is further configured to determine a second DBI bit associated with the third block of data based on the comparison between the DBI bit associated with the second block of data and the second preliminary DBI bit using XOR logic.

18. An apparatus, comprising:
an error correction code (ECC) generator configured to receive a first block of data and a second block of data to be written to a memory array, the ECC circuit further configured to perform an ECC operation on the second block of data to provide an ECC;
data bus inversion (DBI) logic configured to determine a DBI bit associated with the second block of data based on a comparison between the first block of data and the second block of data;
a DBI inverter coupled to the DBI logic, the DBI inverter configured to provide DBI data based on the second block of data and the DBI bit, wherein provision of the DBI data comprises inversion of at least a portion of the second block of data responsive to the DBI bit having a particular logical value; and
a second DBI inverter coupled to the DBI inverter via a plurality of signal lines, the second DBI inverter configured to recover a corrected block of data based on the DBI data and the DBI bit, wherein recovery of the second block of data comprises inversion of at least a portion of the DBI data responsive to the DBI bit having the particular logical value,
wherein the ECC generator is configured to receive the second block of data from the second DBI inverter.

19. The apparatus of claim 18, further comprising a deserializer configured to provide the first block of data based on a received first plurality of sub-blocks and to provide the second block of data based on a received second plurality of sub-blocks.

20. An apparatus, comprising:
an error correction code (ECC) generator configured to receive a first block of data and a second block of data to be written to a memory array, the ECC circuit further configured to perform an ECC operation on the second block of data to provide an ECC;
data bus inversion (DBI) logic configured to determine a DBI bit associated with the second block of data based on a comparison between the first block of data and the second block of data;
a DBI inverter coupled to the DBI logic, the DBI inverter configured to provide DBI data based on the second block of data and the DBI bit, wherein provision of the DBI data comprises inversion of at least a portion of the second block of data responsive to the DBI bit having a particular logical value; and
a deserializer configured to provide the first block of data based on a received first plurality of sub-blocks and to provide the second block of data based on a received second plurality of sub-blocks;
a second DBI inverter coupled to the DBI inverter via a plurality of signal lines, the second DBI inverter configured to recover a corrected block of data based on the DBI data and the DBI bit, wherein recovery of the second block of data comprises inversion of at least a portion of the DBI data responsive to the DBI bit having the particular logical value,
wherein the ECC generator is coupled between the deserializer and the DBI inverters, the ECC generator configured to provide the ECC to the DBI inverters, the DBI inverters further configured to provide the ECC to the second DBI inverters.

21. An apparatus, comprising:
an error correction code (ECC) generator configured to receive a first block of data and a second block of data to be written to a memory array, the ECC circuit further configured to perform an ECC operation on the second block of data to provide an ECC;
data bus inversion (DBI) logic configured to determine a DBI bit associated with the second block of data based on a comparison between the first block of data and the second block of data;
a DBI inverter coupled to the DBI logic, the DBI inverter configured to provide DBI data based on the second block of data and the DBI bit, wherein provision of the DBI data comprises inversion of at least a portion of the second block of data responsive to the DBI bit having a particular logical value; and a deserializer configured to provide the first block of data based on a received first plurality of sub-blocks and to provide the second block of data based on a received second plurality of sub-blocks; and a second DBI inverter coupled to the DBI inverter via a plurality of signal lines, the second DBI inverter configured to recover a corrected block of data based on the DBI data and the DBI bit, wherein recovery of the second block of data comprises inversion of at least a portion of the DBI data responsive to the DBI bit having the particular logical value, wherein the ECC generator is coupled between the deserializer and the DBI logic, the ECC generator is configured to provide the ECC to the DBI logic, the DBI logic further configured to provide the DBI bit based on a comparison between the ECC and an ECC associated with the first block of data.

22. The apparatus of claim 18, further comprising an array access circuit coupled to the second DBI inverters and configured to provide the corrected block of data to the memory array.

23. A method, comprising:

receiving a block of data at a data bus inversion (DBI) circuit;

determining, in parallel, a plurality of preliminary DBI bits based on the block of data, wherein individual ones of the plurality of preliminary DBI bits are associated with respective sub-blocks of a plurality of sub-blocks of the block of data;

determining, serially, a plurality of DBI bits based on the plurality of preliminary DBI bits by setting a value of a DBI bit of a plurality of DBI bits associated with a sub-block of the plurality of sub-blocks based on a comparison using XOR logic between a preliminary DBI bit of the plurality of preliminary DBI bits associated with sub-block and a DBI bit of the plurality of DBI bits associated with a preceding sub-block of the plurality of sub-blocks to, wherein individual ones of the plurality of DBI bits are associated with respective ones of the plurality of sub-blocks; and inverting bits of sub-blocks of the plurality of sub-blocks that are associated with DBI bits of the plurality of DBI bits having a particular logical value to provide DBI data.

24. The method of claim 23, wherein determining a plurality of preliminary DBI bits comprises:

comparing, in parallel, individual ones of the plurality of sub-blocks with preceding sub-blocks using bitwise XOR logic; and setting, in parallel, a value of the each of the plurality of preliminary DBI bits based on a respective sum of outputs of the bitwise XOR logic.

25. The method of claim 24, wherein setting, in parallel, a value of the each of the plurality of preliminary DBI bits based on a respective sum of outputs of the bitwise XOR logic comprises:

summing the outputs of a bitwise XOR operation associated with a preliminary DBI bit of the plurality of preliminary DBI bits;

setting the preliminary DBI bit of the plurality of preliminary DBI bits to a first logical value responsive to the sum of the outputs of a bitwise XOR operation associated with the preliminary DBI bit being greater than; and setting the preliminary DBI bit to a second logical value responsive to the sum of the outputs of a bitwise XOR operation associated with the preliminary DBI bit being less than.

26. The method of claim 23, further comprising performing an error correction code (ECC) operation on the block of data to provide a corrected block of data in parallel with determining the plurality of preliminary DBI bits and determining the plurality of DBI bits, wherein inverting the bits of sub-blocks of the plurality of sub-blocks that are associated with DBI bits of the plurality of DBI bits having the particular logical Value to provide DBI data comprises inverting sub-blocks of the corrected block of data.

27. The method of claim 23, further comprising serializing the DBI data for output to a plurality of outputs.

28. A method, comprising:

receiving a first block of data and a second block of data at a memory circuit;

performing an error correction code (ECC) operation on the second block of data to provide a corrected block of data;

in parallel with performing the ECC operation, determining an internal data bus inversion (DBI) bit associated with the second block of data based on a comparison between the first block of data and the second block of data; and inverting at least a portion of the corrected block of data responsive to the DBI bit having a particular logical value to provide internal DBI data;

recovering the corrected block of data based on the internal DBI data and the internal DBI bit by inverting of at least a portion of the internal DBI data responsive to the DBI bit having a first particular logical value;

determining an external DBI bit associated with the corrected block of data based on a comparison between a first sub-set of the corrected block of data with a second sub-set of the corrected block of data; and inverting at least a portion of the corrected block of data responsive to the external DBI bit having a particular logical value to provide external DBI data; and providing the external DBI data and the external DBI bit to a plurality of signal lines of the memory circuit.

29. The method of claim 28, further comprising:

receiving the external DBI data and the external DBI bit from the plurality of signal lines; and recovering the corrected block of data based on the external DBI data and the external DBI bit by inverting of at least a portion of the external DBI data responsive to the external DBI bit having a second particular logical value.

30. The method of claim 29, further comprising after recovering the corrected block of data, serializing the corrected block of data for output to a plurality of outputs.

* * * * *